(12) United States Patent
Miyashita

(10) Patent No.: US 6,263,196 B1
(45) Date of Patent: Jul. 17, 2001

(54) CHANNEL SELECTION CONTROL IN A SELECTIVE CALL RECEIVER

(75) Inventor: Mafumi Miyashita, Shizuoka (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/013,903

(22) Filed: Jan. 27, 1998

(30) Foreign Application Priority Data

Jan. 28, 1997 (JP) .................................................. 9-014230

(51) Int. Cl.$^7$ .................................................. H04B 1/18
(52) U.S. Cl. ................................... 455/161.1; 455/161.2; 455/161.3; 455/249.1
(58) Field of Search ............................. 455/161.1, 161.2, 455/161.3, 249.1, 254

(56) References Cited

U.S. PATENT DOCUMENTS

| | | |
|---|---|---|
| 4,166,927 | 9/1979 | Hamaoki . |
| 4,620,147 | 10/1986 | Niki . |
| 5,369,799 | * 11/1994 | Tsunoda ............................... 455/38.3 |
| 5,448,774 | * 9/1995 | Yokozaki et al. ..................... 455/343 |

FOREIGN PATENT DOCUMENTS

| | | |
|---|---|---|
| 2 285 327 | 7/1995 | (GB) . |
| 2 296 633 | 7/1996 | (GB) . |
| 1-202939 | 9/1989 | (JP) . |
| 222732 | 4/1994 | (JP) . |
| 6-315001 | 11/1994 | (JP) . |
| 253088 | 8/1995 | (JP) . |
| 260853 | 10/1995 | (JP) . |
| 268173 | 1/1996 | (JP) . |

* cited by examiner

Primary Examiner—Daniel Hunter
Assistant Examiner—Lana Le
(74) Attorney, Agent, or Firm—Young & Thompson

(57) ABSTRACT

In a radio selective call receiver, the sensitivity of a radio receiver is set to a lower sensitivity level which is lower than a normal sensitivity level of the radio receiver. In the lower sensitivity level, a plurality of predetermined channels are searched for a receiving channel while receiving a radio signal. Therefore, a receiving channel with higher signal level can be selected. When no receiving channel is found in the lower sensitivity, the channel search is performed in the normal sensitivity.

10 Claims, 4 Drawing Sheets

| X=1 |
| Y=2 |

X: PRESET NUMBER OF TIMES SEARCH IS REPEATED AT NORMAL SENSITIVITY

Y: PRESET TOTAL NUMBER OF TIMES SEARCH IS REPEATED

CHANNEL SELECTION CONTROL IN A SELECTIVE CALL RECEIVER

BACKGROUND OF THE INVENTION

1. Field of the Invention

The present invention relates to a radio selective call receiver and, more specifically, to a channel selection control method in the radio selective call receiver.

2. Description of the Related Art

There has been proposed a receiver having a channel selection function of selecting a receiving channel by scanning a frequency channel scan list (for example, Japanese Patent Unexamined Publication No. 6-315001).

Further, a cordless telephone having an available-channel determination function has been disclosed in Japanese Patent Unexamined Publication No. 1-202939. The cordless telephone is provided with an attenuator at the previous stage of a high-frequency amplifier. Since the attenuator attenuates the level of radio received signal, the effect of strong interference waves can be reduced.

In the conventional receivers as described above, however, the receiving sensitivity is set to a maximum level to increase the probability of detection of a calling area. Therefore, in cases where a plurality of calling areas are overlapped, an optimal calling channel is not always detected. There is a possibility that a receiving channel with lower signal level is selected.

SUMMARY OF THE INVENTION

An object of the present invention is to provide a channel selection control method which can increase the reliability of receiving channel.

Another object of the present invention is to provide a radio selective call receiver and a channel selection control method which are capable of establishing synchronization with reliability in the case of two or more radio selective calling signals being overlapped.

According to an aspect of the invention, the sensitivity of a radio receiver is set to a first sensitivity level which is lower than a second sensitivity level of the radio receiver. In the first sensitivity level, the predetermined channels are searched for a receiving channel while receiving a radio signal before searching in the second sensitivity level.

Since the radio signal is received and a receiving channel is searched for in the state that the sensitivity of the radio receiver is lowered, receiving channel with higher signal level can be selected and the synchronization can be established.

According to another aspect of the present invention, in a radio selective call receiver having a channel scan function of scanning a plurality of predetermined channels in a predetermined order to search for a receiving channel, after a radio received signal is attenuated by a predetermined amount to produce a first radio received signal, the first radio received signal is demodulated to a first baseband received signal and it is determined whether a predetermined signal format is detected from the first baseband received signal. When the predetermined signal format is not detected, the predetermined channels are scanned according to the predetermined order in the attenuation state that the radio received signal is attenuated.

Further, when the predetermined signal format is not detected from the first baseband received signal, the radio received signal which is not attenuated is demodulated to a second baseband received signal, and it is determined whether the predetermined signal format is detected from the second baseband received signal. When the predetermined signal format is not detected from the second baseband received signal, the predetermined channels are scanned according to the predetermined order a first predetermined number of times in the normal state that the radio received signal is not attenuated.

Since the channel scan is performed in the normal state after the receiving channel has not been found in the attenuation state, a receiving channel with higher signal level can be selected with reliability.

DESCRIPTION OF THE PREFERRED EMBODIMENT

Figure 1:
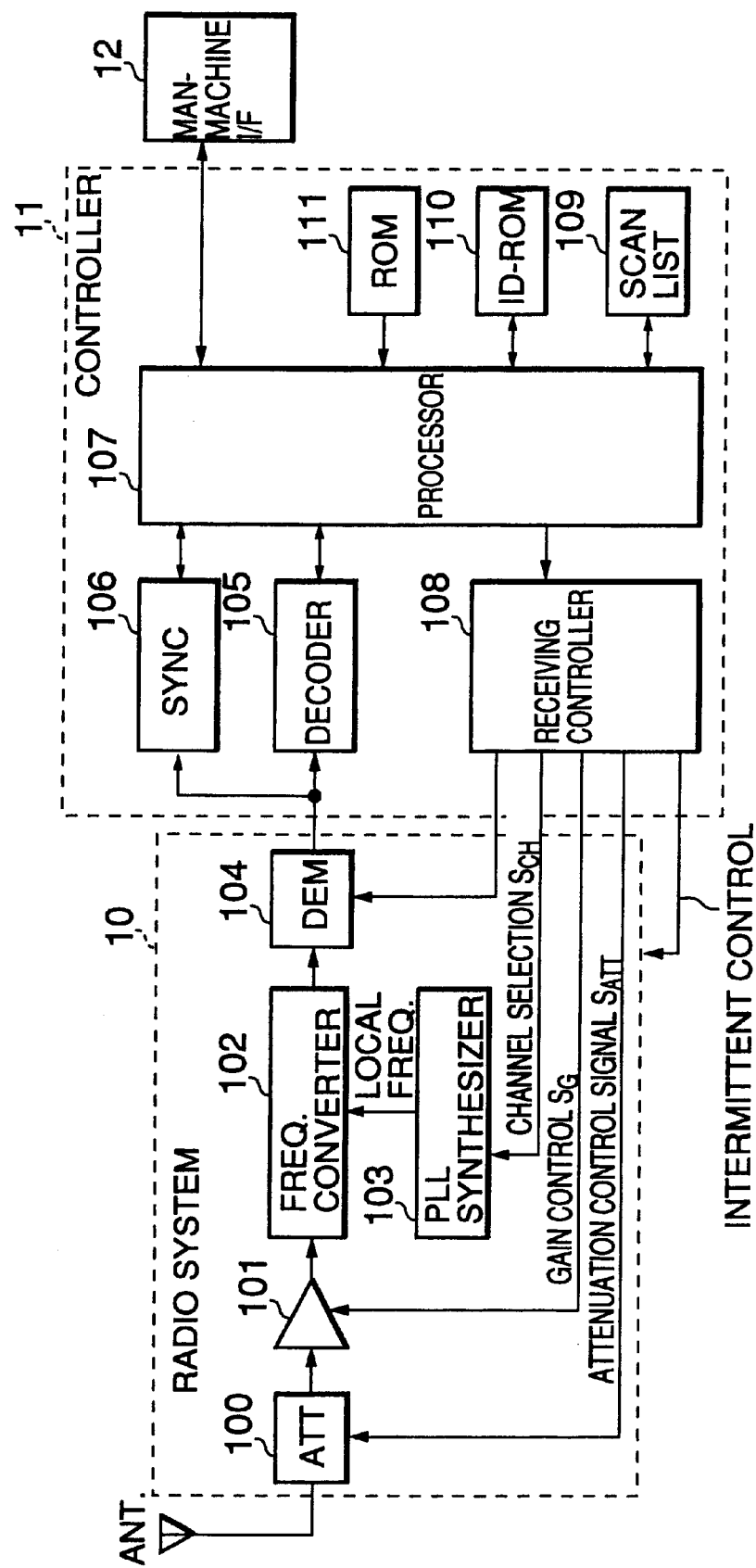
FIG. 1 is a block diagram showing an embodiment of a radio selective call receiver according to the present invention.

Referring to FIG. 1, a selective call receiver according to the present invention is mainly comprised of a radio system 10, a controller 11, and a man-machine interface 12. The radio system 10 is connected to an antenna and receives radio waves through the antenna. The controller 11 inputs a baseband received signal from the radio system 10 and controls the radio system as will be described. The man-machine interface 12 includes a display such as liquid-crystal display, a keypad, and an informer such as a beeper, and LED or a vibrator.

The radio system 10 includes a variable attenuator 100 which attenuates radio waves received from the antenna under the control of the controller 11. The radio waves output from the attenuator 100 are amplified by a variable-gain high frequency amplifier 101 and then are output to a frequency converter 102.

The frequency converter 102 is comprised of a radio-frequency (RF) filter, a mixer and an intermediate-frequency (IF) filter, which are not shown in this figure. A PLL (phase-locked loop) synthesizer 103 generates a local frequency signal having a frequency controlled by a channel selection signal $S_{CH}$. In the frequency converter 103, after passing through the RF filter, the radio waves are converted to an IF signal of a designated frequency by the mixer mixing the radio waves with the local frequency signal generated by the PLL synthesizer 103. The IF signal passing through the IF filter is output to a demodulator 104. The demodulator 104 demodulates the IF signal into a baseband signal which is output to the controller 11.

Figure 5:
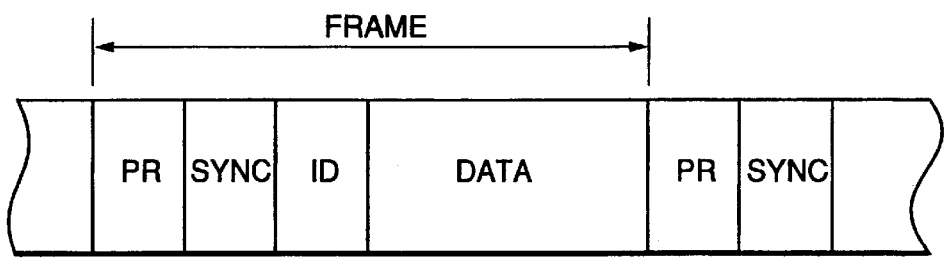
FIG. 5 is a diagram showing a signal format of a selective calling signal.

In the controller 11, a decoder 105 and a sync signal detector 106 receive the baseband received signal from the demodulator 104 of the radio system 10. The decoder 105 performs a decoding operation with error-correction of the received baseband signal and then outputs decoded and error-corrected data to a processor 107. The sync signal detector 106 detects a sync signal (SYNC) of each frame from the received baseband signal (see FIG. 5). Upon detecting the sync signal, the sync signal detector 106 outputs a sync interrupt signal to the processor 107.

The controller 11 further includes a receiving controller 108 and a scan list memory 109. More specifically, the receiving controller 108 outputs an attenuation control signal $S_{ATT}$ to the variable attenuator 100. The receiving controller 108 further outputs a gain control signal $S_C$ and a channel selection signal $S_{CH}$ to the high-frequency amplifier 101 and the PLL synthesizer 103, respectively. Furthermore, the receiving controller 108 performs well-known intermittent receiving control of the radio system 10.

The channel selection control according to the present invention, as will be described later, is performed by the processor 107 while referring to the scan list memory 109 and the receiving controller 108 outputting the attenuation control signal $S_{ATT}$, the gain control signal $S_G$ and the channel selection signal $S_{CH}$.

An ID-ROM (identification read-only memory) 110 and a ROM 111 are connected to the processor 107. The ID-ROM 110 stores a predetermined identification number and the ROM 111 stores program including a channel selection control program and a message receiving program. By running necessary programs stored in the ROM 111, the processor 107 can implement necessary functions of the selective call receiver. For example, after synchronization has been established according to the channel selection control program, the processor 107 runs the message receiving program to compare a calling number included in a received selective calling signal with the predetermined identification number stored in the ID-ROM 110. When they are coincident to each other, the processor 107 controls the man-machine interface 12 to inform the user of the incoming call and to display a received message on screen.

Figures 2A, 2B:
FIG. 2A is a schematic diagram showing the scan list data stored in a scan list memory as shown in FIG. 1.
FIG. 2B is a schematic diagram showing the preset number X of times channel search is repeated at normal sensitivity and the preset total number Y of times channel search is repeated.

Referring to FIG. 2A, the scan list memory 109 stores the sequence of designation of frequency channels $CH_1$–$CH_K$. the receiving channel is designated according to the sequence from the frequency channel $CH_1$ to the last frequency channel $CH_K$. After the frequency channel $CH_K$ is designated, the designation position returns to the top frequency channel $CH_1$.

Referring to FIG. 2B, the scan list memory 109 further stores preset data consisting of a present maximum number X of times that channel search repeats at normal sensitivity and a preset maximum total number Y of times that channel search repeats. The preset data X and Y are used in channel selection control procedure. Hereinafter, it is assumed that X=1 and Y=2. That is, the permissible number of times that channel search repeats at normal sensitivity is restricted to 1 and the permissible total number of times that channel search repeats is restricted to 2.

CHANNEL SELECTION CONTROL

Figure 3:
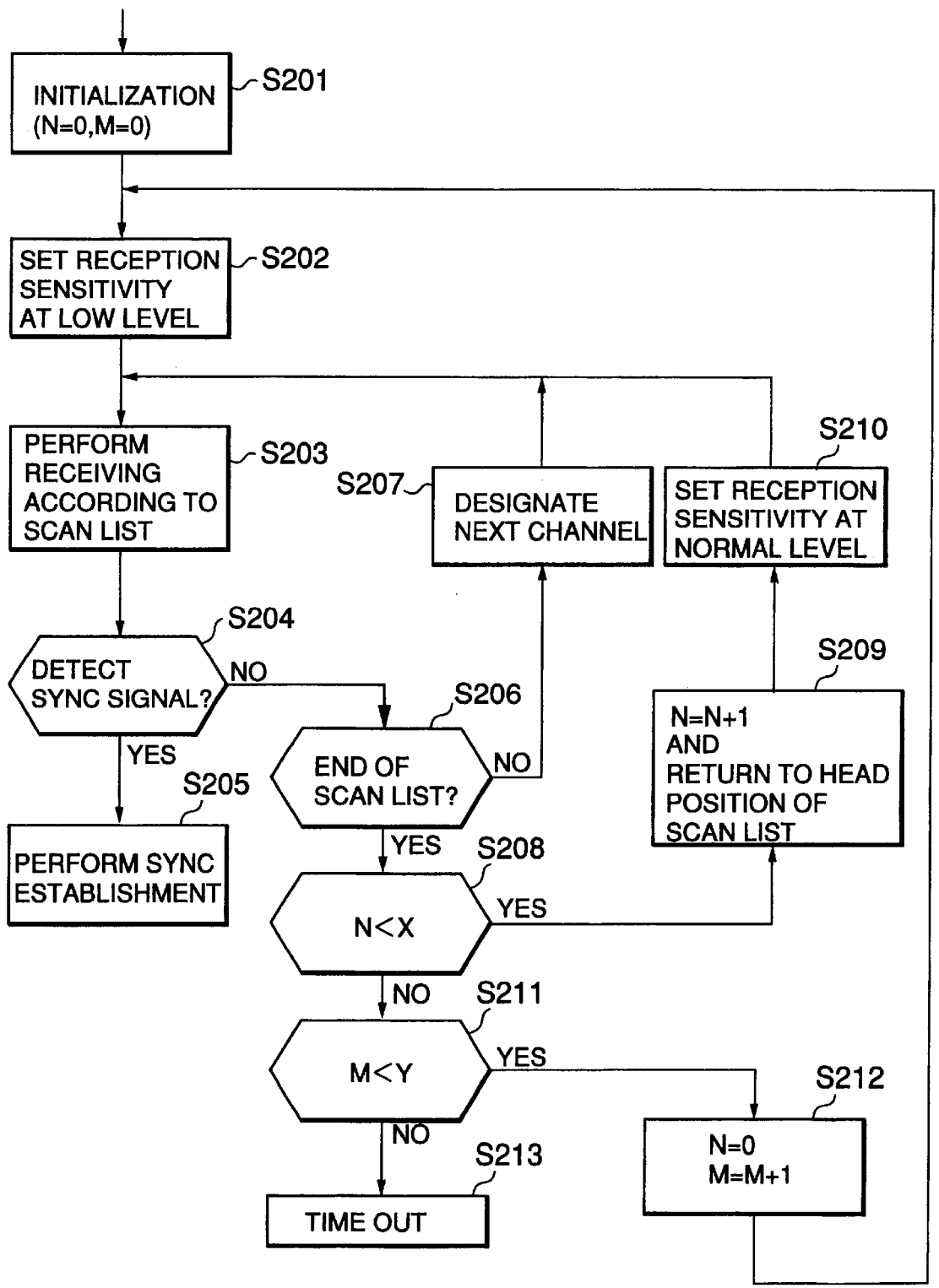
FIG. 3 is a flowchart showing an embodiment of a channel selection control method according to the present invention.

Referring to FIG. 3, when power is turned on, initialization is performed such that a first variable N indicating the number of times that channel search has repeated at normal sensitivity level and a second variable M indicating the total number of times that channel search has repeated are both reset to zero (step S201).

Subsequently, the receiving controller 108 outputs the attenuation control signal $S_{ATT}$ the attenuator 100 so that received radio signals are attenuated by a predetermined amount (step S202). In other words, the reception sensitivity is set to a level lower than the normal level.

In the low sensitivity state, the receiving operation is started according to the scan list stored in the scan list memory 109. First, the processor 107 gets access to the head location of the scan list memory 109 and designates the frequency channel CH, as a receiving channel by setting the PLL synthesizer 103 to an oscillation state corresponding to the frequency channel $CH_1$ (step S203). When receiving a radio selective calling signal at the frequency channel $CH_1$, it is checked whether the sync signal or the like is detected from the received selective calling signal (step S204). When the sync signal or the like has been detected (YES in step S204), the sync establishment procedure is performed at the frequency channel $CH_1$ (step S205).

When the sync signal or the like has not been detected (NO in step S204), it is checked whether the present channel designation position is at the end of the scan list (step S206). If it is not at the end of the scan list (NO in step S206), the next channel is designated (step S207) and then the above scan steps S203–S206 are repeated until the sync signal is detected or the channel designation position reaches the end of scan list. In other words, the channel search in the low sensitivity state is repeated according to the sequence of frequency channels stored in the scan list memory 109 until the sync signal is detected or the channel designation position reaches the end of scan list.

When all the frequency channels have been scanned without detecting the sync signal (YES in step S206), it is checked whether the first variable N indicating the number of times that channel search has repeated at normal sensitivity level is smaller than the present maximum number X (here, X=1) (step S208). Since N=0 in this state (YES in step S208), the processor 107 increments the first variable N (therefore, N=1), and returns the channel designation position to the head of the scan list (step S209). Further, the receiving controller 108 outputs the attenuation control signal $S_{ATT}$ to the attenuator 100 so that received radio signals are not attenuated (step S210). In other words, when the sync signal has never been detected over the frequency channels in the low sensitivity state, the reception sensitivity is switched to the normal level.

In the normal sensitivity state, the receiving operation is performed according to the scan list as described above (steps S203–S206). When the sync signal has never been detected over the frequency channels in the normal sensitivity state (YES in step S206), it is checked whether the first variable N (here, N=1) is smaller than the present maximum number X (step S208).

If the first variable N is smaller than the preset maximum number X (YES in step S208), the above steps S209, S210 and S203–S206 are repeated. If the first variable N is equal to or greater than the preset maximum number X (NO in step S208), it is further checked whether the second variable M (here, M=0) indicating the total number of times that channel search has repeated is smaller than the preset maximum total number Y of times that channel search repeats (step S211). When the second variable M is smaller than Y (YES is step S211), the first variable N is reset to zero and the second variable M is incremented (step S212). After that, the receiving controller 108 outputs the attenuation control signal $S_{ATT}$ to the attenuator 100 so that received radio signals are attenuated by a predetermined amount (step S202) and the above steps S203–S212 are repeated until the second variable M is equal to or greater than Y. If the second variable M is equal to or greater than Y (NO in step S211), it is determined that there is no available channel (step S213).

Figure 4:
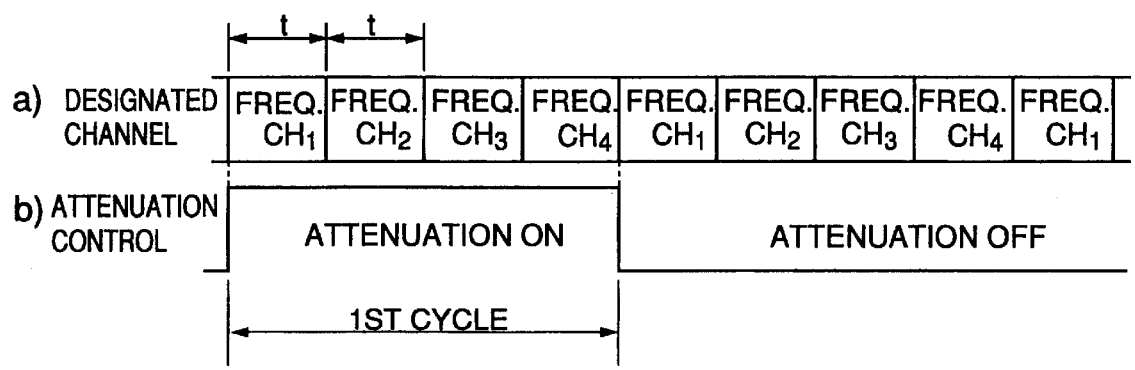
FIG. 4 is a schematic diagram showing an example of the operation of channel selection control according to the present invention.

Referring to FIG. 4, it is assumed that the sequence of 4 frequency channels $CH_1$–$CD_4$ is predetermined in the order presented. In this case, the receiving operation is performed in the low receiving sensitivity for the first cycle from the frequency channel $CH_1$ to $CH_4$. The time required for detection of the sync signal for each frequency channel may be set to a predetermined time period t. In the case where the sync signal cannot be detected during the first cycle, the receiving sensitivity is set to the normal level and then the receiving operation is repeated.

In this manner, the channel scan is performed in the low sensitivity state and, if no channel is found, then the channel scan is further performed in the normal sensitivity state. Since the channel scan is first performed in the low sensitivity state, it is possible to select a radio channel having a stronger signal level from a plurality of available radio channels. Therefore, in the case where a plurality of calling areas are overlapped, the selective call receiver according to the present invention increases the possibility of selecting an optimal radio channel. Further, it is possible to avoid causing a channel not to be detected due to instantaneous sensitivity reduction such as fading.

The attenuation of receiving radio signals may be achieved not only by the attenuator 100 but also by both the attenuator 100 and the high-frequency amplifier 101. More specifically, by controlling an attenuation amount of the attenuator 100 and a gain of the amplifier 101, the signal level of received radio signals can be set to three or more levels. Therefore, the channel selection may be sequentially performed for the signal levels of received radio signals in the ascending order.

What is claimed is:

1. A method for searching a plurality of predetermined channels for a receiving channel in a radio receiver, comprising the steps of:
   a) setting sensitivity of the radio receiver to a first sensitivity level which is lower than a second sensitivity level of the radio receiver; and
   b) searching the predetermined channels for the receiving channel while receiving a radio signal in the first sensitivity level before searching in the second sensitivity level.

2. The method according to claim 1, further comprising the steps of:
   c) setting sensitivity of the radio receiver to the second sensitivity level when the receiving channel has not been found in the step b); and
   d) searching the predetermined channels for the receiving channel while receiving a radio signal in the second sensitivity level.

3. The method according to claim 2, wherein the step d) is repeated a first predetermined number of times when the receiving channel has not been found; and
   the steps a) to d) are repeated a second predetermined number of times when the receiving channel has not been found.

4. A method for searching a plurality of predetermined channels for a receiving channel in a radio receiver, comprising the steps of:
   a) setting sensitivity of the radio receiver to a first sensitivity level which is lower than a second sensitivity level of the radio receiver; and
   b) searching the predetermined channels for the receiving channel while receiving a radio signal in the first sensitivity level before searching in the second sensitivity level, wherein the step b) comprises the steps of:
   b-1) selecting a first channel from the predetermined channels;
   b-2) receiving the radio signal at the first channel;
   b-3) determining whether a predetermined signal format is detected from the ratio signal within a predetermined time period;
   b-4) designating the first channel as the receiving channel when the predetermined signal format is detected from the radio signal within the predetermined time period; and
   b-5) repeating the steps b-1) to b-4) while sequentially selecting a channel from the predetermined channels in a predetermined order until the predetermined channels have been selected.

5. A radio selective call receiver comprising:
   a signal level adjuster for adjusting a signal level of a radio received signal to produce an adjusted radio received signal;
   a channel selector for selecting a receiving channel from a plurality of predetermined channels in a predetermined order;
   a demodulator for demodulating the adjusted radio received signal obtained at a selected receiving channel to produce a first baseband received signal;
   a detector for detecting a predetermined signal format from the first baseband received signal; and
   a controller for controlling the signal level adjuster and the channel selector such that the signal level adjuster decreases the signal level of the radio received signal to produce the adjusted radio received signal and, when the predetermined signal format is not detected from the first baseband received signal, the channel selector scans the predetermined channels according to the predetermined order in a decreased signal level state,
   wherein the controller controls the signal level adjuster and the channel selector such that the signal level adjuster sets the signal level of the radio received signal to a normal level when the predetermined signal format has not been detected from the first baseband received signal in the decreased signal level state and the channel selector scans the predetermined channels a first predetermined number of times according to the predetermined order in a normal level state.

6. The radio selective call receiver according to claim 5, wherein the signal level adjuster comprises:
   a variable attenuator for attenuating the radio received signal to produce a first radio received signal; and
   an variable-gain amplifier for amplifying the first radio received signal to produce the adjusted radio received signal.

7. The radio selective call receiver according to claim 5, wherein the signal level adjuster comprises:
   a variable attenuator for attenuating the radio received signal to produce the adjusted radio received signal.

8. The radio selective call receiver according to claim 5, wherein the controller controls the signal level adjuster and the channel selector such that the signal level adjuster sets the signal level of the radio received signal to a normal level when the predetermined signal format has not been detected from the first baseband received signal in the decreased signal level state and the channel selector scans the predetermined channels a first predetermined number of times according to the predetermined order in a normal level state.

9. The radio selective call receiver according to claim 5, wherein the controller controls the signal level adjuster and the channel selector such that the predetermined channels are scanned a second predetermined number of times in the decreased signal level state and the normal level state.

10. A storage medium storing a control program for searching a plurality of predetermined channels for a receiving channel in a radio receiver, the control program comprising the steps of:

a) setting sensitivity of the radio receiver to a first sensitivity level which is lower than a second sensitivity level of the radio receiver;

b) searching the predetermined channels for the receiving channel while receiving a radio signal in the first sensitivity level before searching in the second sensitivity level.

\* \* \* \* \*